United States Patent
Hu et al.

(10) Patent No.: US 10,910,402 B1
(45) Date of Patent: Feb. 2, 2021

(54) THREE-DIMENSIONAL AND FLASH MEMORY AND MANUFACTURING METHOD THEREOF

(71) Applicant: MACRONIX International Co., Ltd., Hsinchu (TW)

(72) Inventors: Chih-Wei Hu, Miaoli County (TW); Teng-Hao Yeh, Hsinchu County (TW); Yu-Wei Jiang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/657,810

(22) Filed: Oct. 18, 2019

(51) Int. Cl.
| | |
|---|---|
| *H01L 21/02* | (2006.01) |
| *H01L 21/311* | (2006.01) |
| *H01L 21/28* | (2006.01) |
| *H01L 27/11565* | (2017.01) |
| *H01L 27/11582* | (2017.01) |
| *H01L 29/51* | (2006.01) |

(52) U.S. Cl.
CPC .... *H01L 27/11582* (2013.01); *H01L 21/0217* (2013.01); *H01L 21/02164* (2013.01); *H01L 21/02636* (2013.01); *H01L 21/31111* (2013.01); *H01L 27/11565* (2013.01); *H01L 29/40117* (2019.08); *H01L 29/513* (2013.01); *H01L 29/518* (2013.01)

(58) Field of Classification Search
CPC ......... H01L 27/11582; H01L 27/11565; H01L 29/40117; H01L 29/513; H01L 29/518; H01L 21/02164; H01L 21/0217; H01L 21/02636; H01L 21/31111
USPC ........................................................ 257/324
See application file for complete search history.

(56) References Cited

U.S. PATENT DOCUMENTS

2017/0148809 A1*  5/2017  Nishikawa .......... H01L 23/5226
2017/0263637 A1*  9/2017  Sakata .............. H01L 29/40117

* cited by examiner

*Primary Examiner* — Tong-Ho Kim
(74) *Attorney, Agent, or Firm* — J.C. Patents

(57) ABSTRACT

A three-dimensional AND type flash memory and a manufacturing method thereof includes steps below is provided. A stack structure includes a first insulating layer and a first sacrificial layer is formed. A first pillar structure through the stack structure includes a second insulating layer and a second sacrificial layer surrounded by thereof is formed. A second pillar structure through the stack structure includes a channel layer and an insulating pillar surrounded by thereof is formed. The second sacrificial layer is located on both sides of the channel layer. The first sacrificial layer is removed. A lateral opening exposing a portion of the second insulating layer and the channel layer is formed. A gate insulating layer surrounding the exposed second insulating layer and channel layer is formed in the lateral opening. A gate layer is filled in the lateral opening. A conductive layer is used to replace the second sacrificial layer.

16 Claims, 14 Drawing Sheets

THREE-DIMENSIONAL AND FLASH MEMORY AND MANUFACTURING METHOD THEREOF

BACKGROUND OF THE INVENTION

1. Field of the Invention

The present invention relates to a three-dimensional flash memory and a manufacturing method thereof, particularly to a three-dimensional AND flash memory and a manufacturing method thereof.

2. Description of Related Art

A non-volatile memory (for example, a flash memory) is a memory widely used in personal computers and other electronic devices because the non-volatile memory has the advantage that stored data does not disappear after power is off.

Flash memory that is commonly used in the industry at present includes an NOR flash memory and an NAND flash memory. However, AND flash memory is rarely mentioned. Since the AND flash memory is also applied to a multi-dimensional flash memory cell array, the AND flash memory has the same integration level and area utilization ratio as the NAND flash memory. Therefore, the development of the AND flash memory has become a current trend.

SUMMARY OF THE INVENTION

The present invention provides a manufacturing method of a three-dimensional AND flash memory, which has the advantages of simple process, high process yield and the like.

The manufacturing method of the three-dimensional AND flash memory of the present invention comprises steps as follows. Firstly, a stack structure are formed on a substrate. The stack structure comprises first insulating layers and first sacrificial layers which are alternately stacked. Next, a first pillar structure penetrating through the stack structure and having a rectangle-like profile is formed. The first pillar structure comprises a second insulating layer and a second sacrificial layer, and the second insulating layer surround the second sacrificial layer. Afterwards, a second pillar structure penetrating through the stack structure and having an elliptical profile is formed. The second pillar structure comprises a channel layer and an insulating pillar, and the channel layer surround the insulating pillar. Each second sacrificial layer is located on two sides of one channel layer and is in contact with the channel layer, and the second sacrificial layer face a long-axis cross section of the second pillar structure. Further, the first sacrificial layers are removed to form a lateral opening. The lateral opening exposes a portion of the second insulating layer and a portion of the channel layer. Then, a gate dielectric layer is formed in the lateral opening. The gate dielectric layer surrounds the second insulating layer and the channel layer which are exposed. After that, a gate layer is filled into the lateral opening. Finally, the second sacrificial layer is replaced with conductor layers.

The present invention provides a three-dimensional AND flash memory having a high operation speed.

The three-dimensional AND flash memory of the present invention comprises a stack structure and pillar structures. The stack structure are located on a substrate and comprises first insulating layers and gate layers which are alternately disposed. A gate dielectric layer is disposed between the first insulating layers and the gate layers. The pillar structure penetrates through the stack structure and comprises an insulating pillar, a channel layer, a conductor layer, and a second insulating layer. The insulating pillar has an elliptical profile. The channel layer surround the insulating pillars. Each conductor layer is located on two sides of one channel layer and is in contact with the channel layer, and the conductor layer face a long-axis cross section of the insulating pillar. The second insulating layer surround a sidewall, not in contact with the channel layer, of the conductor layer. The gate dielectric layer surrounds a sidewall of the pillar structure exposed by the first insulating layers.

Based on the above, the positions of the conductor layers to be subsequently formed are defined by sequentially forming the first pillar structures and the second pillar structures, so that the conductor layers are formed by a simple process and have high process yield. In addition, in the three-dimensional AND flash memory of the present invention, each pillar structure comprises an independent conductor layer, and therefore, a memory cell (the intersection points of the gate layers and the pillar structures) is arbitrarily selected by selecting a certain gate layer and a certain conductor layer, so that the three-dimensional AND flash memory of the present invention has a high operation speed.

In order to make the aforementioned and other objectives and advantages of the present invention comprehensible, embodiments accompanied with figures are described in detail below.

DESCRIPTION OF THE EMBODIMENTS

FIG. 1A to FIG. 1L are schematic views showing a manufacturing method of a three-dimensional AND flash memory according to an embodiment of the present invention. FIG. 2 is a side schematic view of FIG. 1I.

Figure 1A:
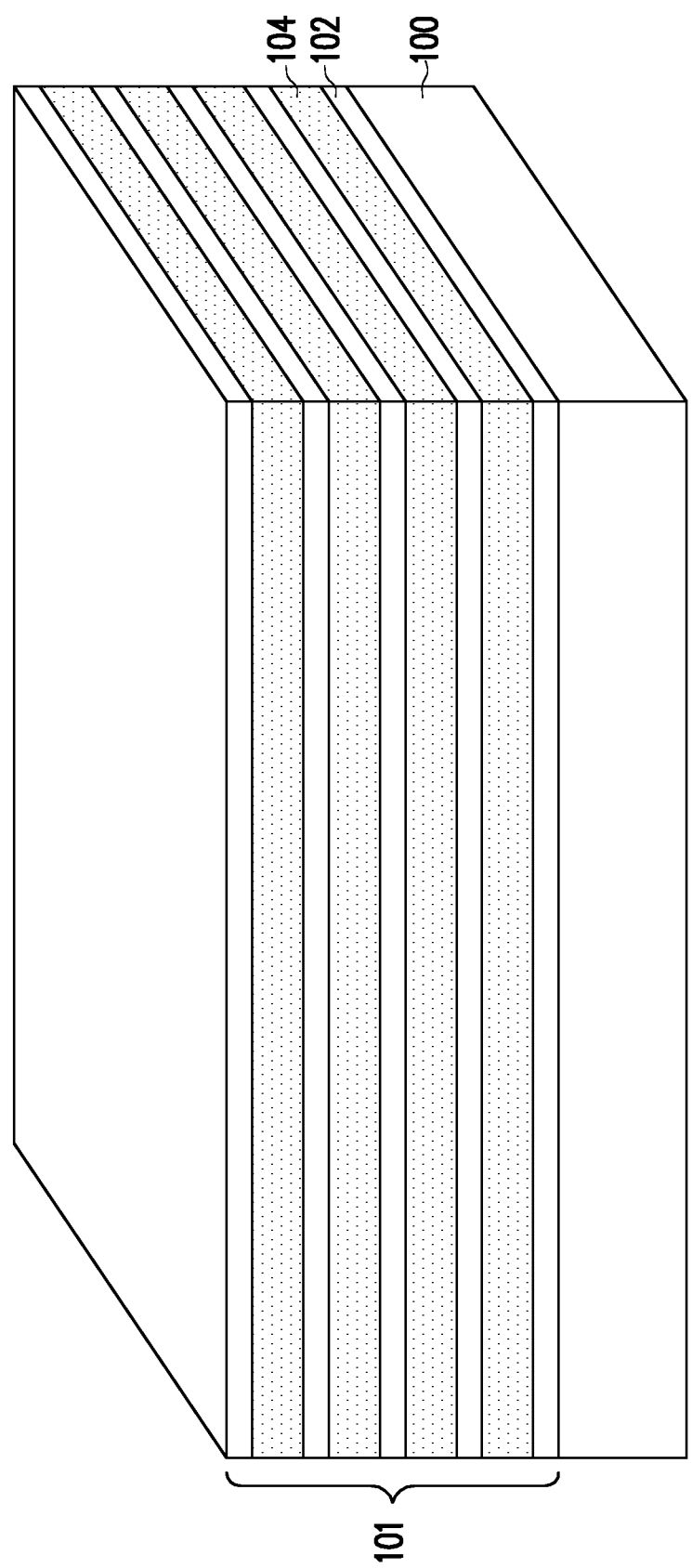
FIG. 1A to FIG. 1L are schematic views showing a manufacturing method of a three-dimensional AND flash memory according to an embodiment of the present invention.
Figure 2:
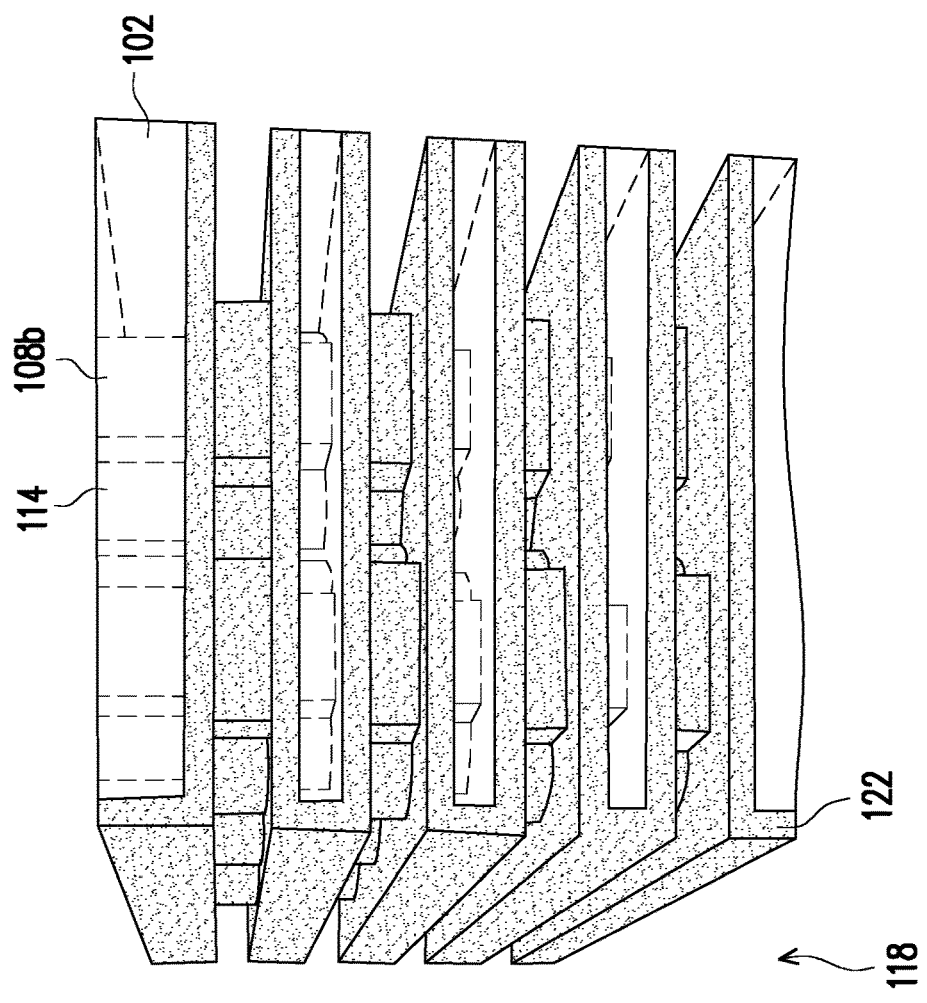
FIG. 2 is a side schematic view of FIG. 1I.

Referring to FIG. 1A, a stack structure 101 are formed on a substrate 100. The substrate 100 is, for example, a semiconductor substrate. For example, the substrate 100 is a silicon substrate. In some embodiments, a doping region (for example, N+ doping region or N-type well region) is formed in the substrate 100 according to design requirements. In other embodiments, a buried oxide layer (not shown) is formed on the substrate 100. In the present embodiment, the substrate 100 defines a unit cell region and a peripheral region due to the subsequent process.

The stack structure 101 include a plurality of first insulating layers 102 and a plurality of first sacrificial layers 104 which are alternately stacked. The material of the first insulating layers 102 is, for example, a dielectric material. For example, the material of the first insulating layers 102 is silicon dioxide. The material of the first sacrificial layers 104 is different from the material of the first insulating layers 102 and has a sufficient etching selectivity ratio with the first insulating layers 102. In some embodiments, the material of the first sacrificial layers 104 is silicon nitride. The first insulating layers 102 and the first sacrificial layers 104 are formed, for example, by performing a plurality of chemical vapor deposition processes. It should be noted here that the number of the first insulating layers 102 and the first sacrificial layers 104 in the stack structure 101 is not limited to the embodiment shown in FIG. 1A. In detail, the number of the first insulating layers 102 and the first sacrificial layers 104 is at least greater than 16 respectively. For example, the number of the first insulating layers 102 and the first sacrificial layers 104 is, for example, 56, 64 or 96. However, the present invention is not limited thereto, and the number of the first insulating layers 102 and the first sacrificial layers 104 in the stack structure 101 depends on the design and density of the desired three-dimensional AND flash memory.

Figure 1B:
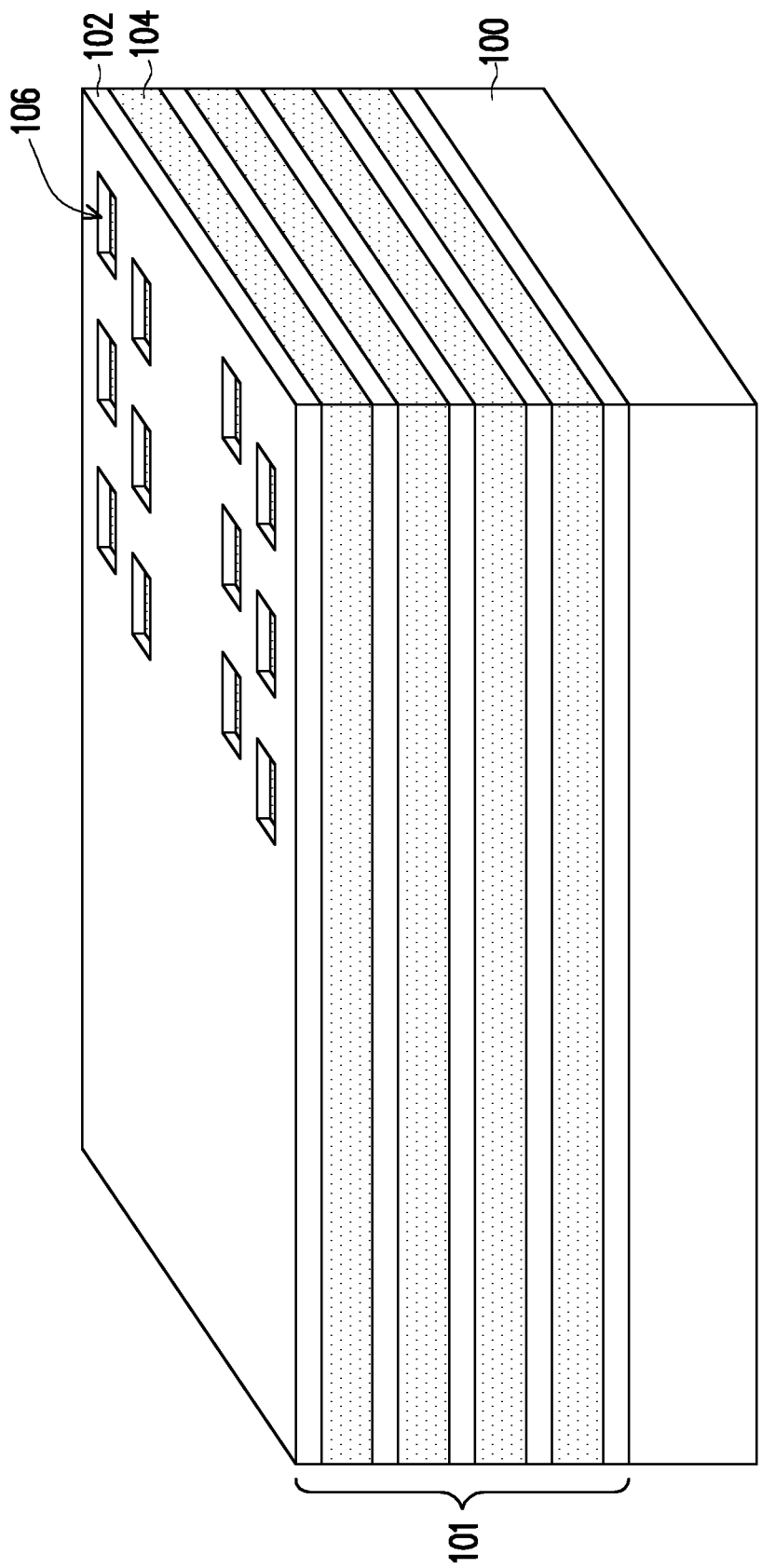

Next, referring to FIG. 1B, a first opening 106 penetrating through the stack structure 101 is formed. The first opening 106 has, for example, a rectangle-like profile. That is, the profile from the top end to the bottom end of the first opening 106 is in a rectangle-like shape. It should be noted here that the rectangle-like shape means that at least one corner of the rectangle is a round corner instead of a square corner, but the present invention is not limited thereto. That is, the first opening 106 also has a rectangular outline. A side surface of the first opening 106, for example, exposes a portion of the first insulating layers 102 and a portion of the first sacrificial layers 104, and a bottom surface of the first opening 106, for example, exposes a portion of the substrate 100. The step of forming the first opening 106 penetrating through the stack structure 101 include, for example, the steps as follows. Firstly, a mask layer (not shown) is formed on the stack structure 101. The mask layer has, for example, an opening having a rectangle-like profile. Afterwards, an etching process is performed on the stack structure 101 by using the mask layer to form the first opening 106 in the stack structure 101. In the present embodiment, the first opening 106 has a substantially vertical sidewall, and based on this, the first opening 106 is also referred to as a first vertical channel (VC) opening.

Figure 1C:
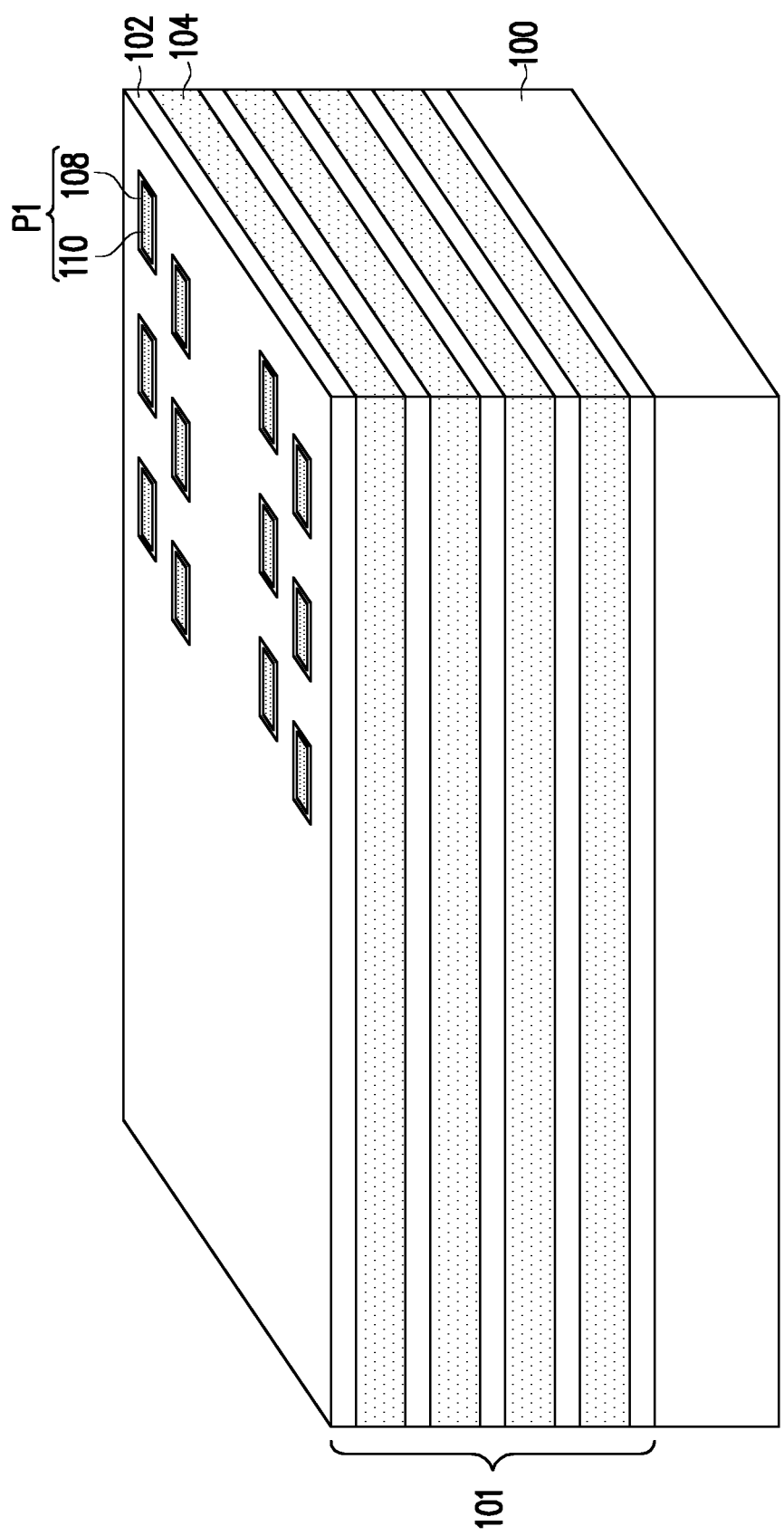

Afterwards, referring to FIG. 1C, second insulating layers 108 are formed on the sidewall of the first opening 106. The second insulating layers 108 are, for example, a conformal layer. In detail, the second insulating layers 108 cover the first insulating layers 102 and the first sacrificial layers 104 on the sidewall of the first opening 106 and expose a portion of the substrate 100 on the bottom surface of the first opening 106 in conformity with the shape of the first opening 106. In other words, the second insulating layers 108 has a similar shape and profile to the first opening 106. The second insulating layers 108 have, for example, a material similar to the first insulating layers 102. For example, the material of the second insulating layers 108 is silicon dioxide.

With continued reference to FIG. 1C, second sacrificial layers 110 are filled into the first opening 106. In the case where the second insulating layers 108 are conformal to the first opening 106, the second sacrificial layers 110 also have, for example, a rectangle-like profile. In the present embodiment, the second sacrificial layers 110 are fully filled in the first opening 106. The second sacrificial layers 110 have, for example, a material similar to the first sacrificial layers 104. For example, the material of the second sacrificial layers 110 is silicon nitride. In the present embodiment, the second insulating layers 108 and the second sacrificial layers 110 constitute first pillar structures P1, and the second insulating layers 108 surround the sidewalls of the second sacrificial layers 110.

Figure 1D:
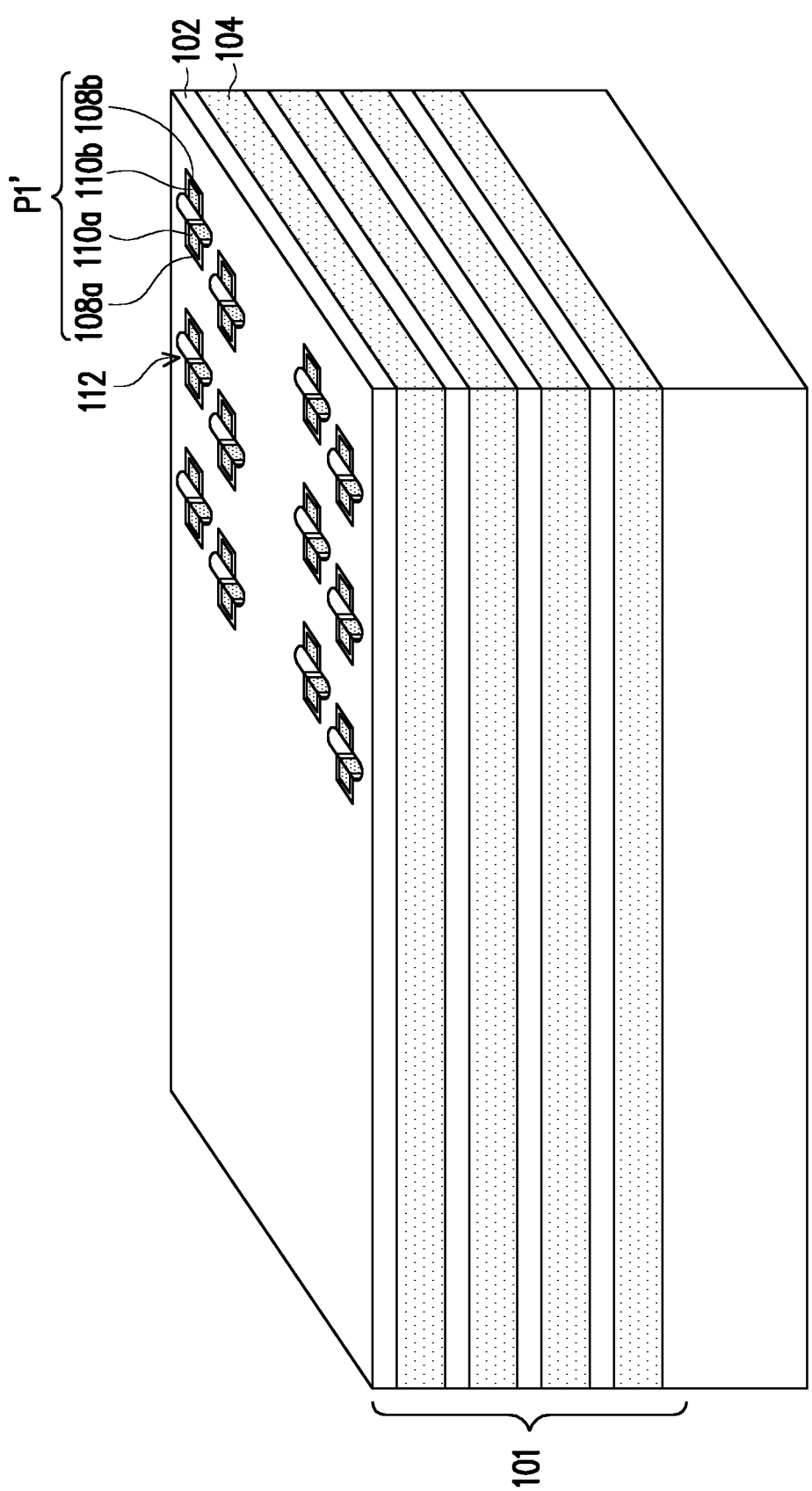

Next, referring to FIG. 1D, a second opening 112 penetrating through the stack structure 101 is formed. The second opening 112 has, for example, an elliptical profile. That is, the profile from the top end to the bottom end of the second opening 112 is elliptical. In the present embodiment, the second opening 112 partially overlaps the first opening 106, and the extending direction of a long axis of the second opening 112 is orthogonal to the extending direction of the length of the first opening 106. In detail, the formed second opening 112 removes a portion of the first pillar structures P1 in addition to a portion of the first insulating layers 102 and a portion of the first sacrificial layers 104. In detail, in the present embodiment, after a portion of the second insulating layers 108 and a portion of the second sacrificial layers 110 are removed, two second insulating layers 108a, 108b and two second sacrificial layers 110a, 110b are respectively formed, which are the remaining first pillar structures P1'. Based on this, the side surface of the second opening 112 exposes, for example, a portion of the first insulating layers 102, a portion of the first sacrificial layers 104, a portion of the second insulating layers 108a, 108b, and a portion of the two second sacrificial layers 110a, 110b. Further, the bottom surface of the second opening 112 exposes, for example, a portion of the substrate 100. The step of forming the second opening 112 penetrating through the stack structure 101 includes, for example, the steps as follows. Firstly, a mask layer (not shown) is formed on the stack structure 101. The mask layer has, for example, an opening having an elliptical profile. Afterwards, an etching process is performed on the stack structure 101 by using the mask layer to form the second opening 112 in the stack structure 101. In the present embodiment, the second opening 112 has a substantially vertical sidewall, and based on this, the second opening 112 is also referred to as a second vertical channel (VC) opening.

Figure 1E:
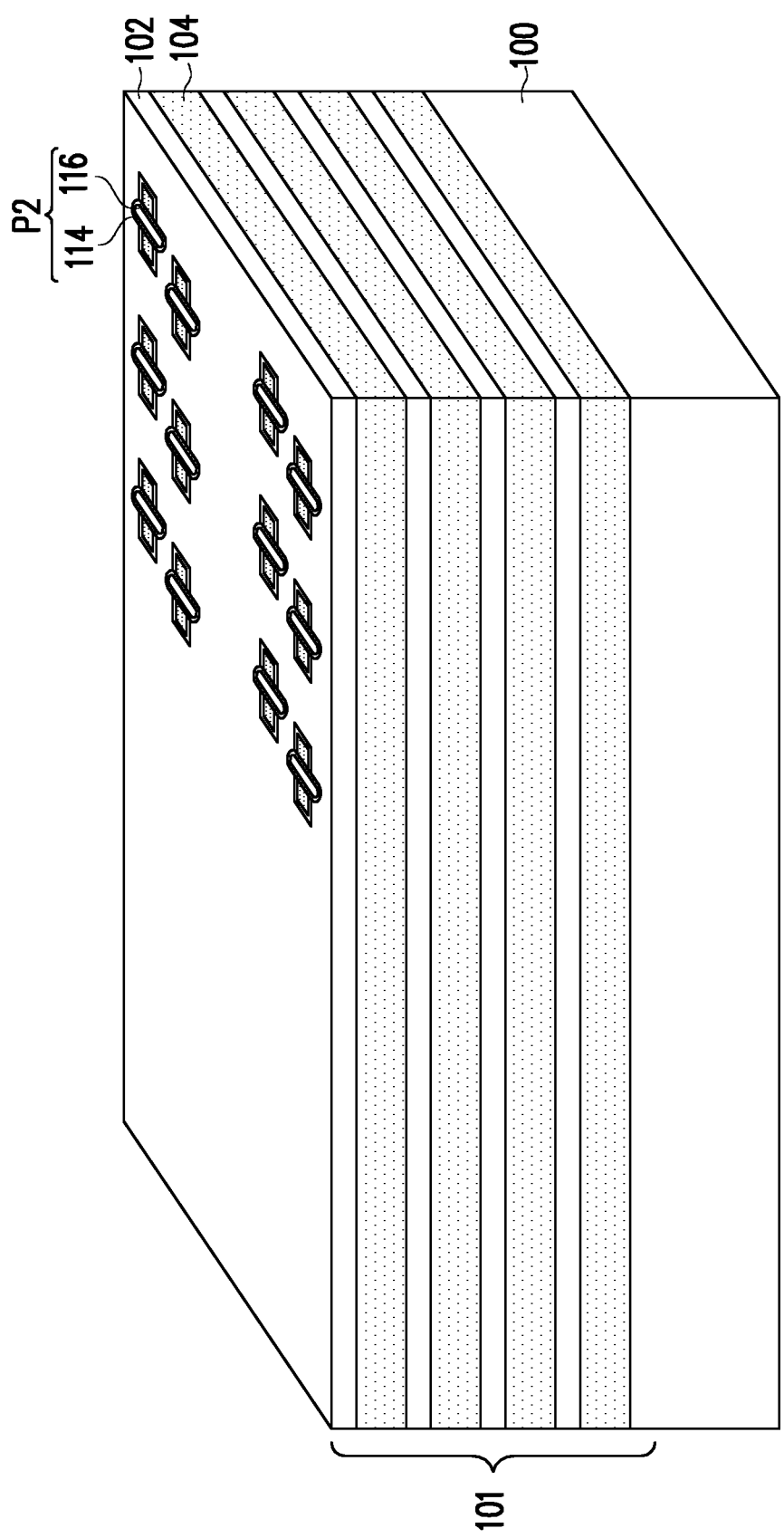

Afterwards, referring to FIG. 1E, channel layers 114 are formed on the sidewall of the second opening 112. The channel layers 114 are, for example, a conformal layer. In detail, the channel layers 114 cover the first insulating layers 102, the first sacrificial layers 104, the second insulating layers 108a, 108b, and the two second sacrificial layers 110a, 110b on the sidewall of the second opening 112 and expose a portion of the substrate 100 on the bottom surface of the second opening 112 in conformity with the shape of the second opening 112. In other words, the channel layers 114 have a similar shape and profile to the second opening 112. The material of the channel layers 114 is, for example, a semiconductor material. For example, the material of the channel layers 114 is polysilicon or doped polysilicon. The above doped polysilicon is doped by performing an in-situ doping or an ion implantation process. The channel layers 114 are used, for example, as a bit line.

With continued reference to FIG. 1E, insulating pillars 116 are filled into the second opening 112. In the case where the channel layers 114 are conformal to the second opening 112, the insulating pillars 116 also have, for example, an elliptical profile. In the present embodiment, the insulating pillars 116 are fully filled in the second opening 112. The insulating pillars 116 have, for example, a material similar to the first insulating layers 102 and the second insulating layers 108. For example, the material of the insulating pillars 116 is silicon dioxide. In the present embodiment, the channel layers 114 and the insulating pillars 116 constitute second pillar structures P2, and the channel layers 114 surround the sidewalls of the insulating pillars 116.

Figure 1F:
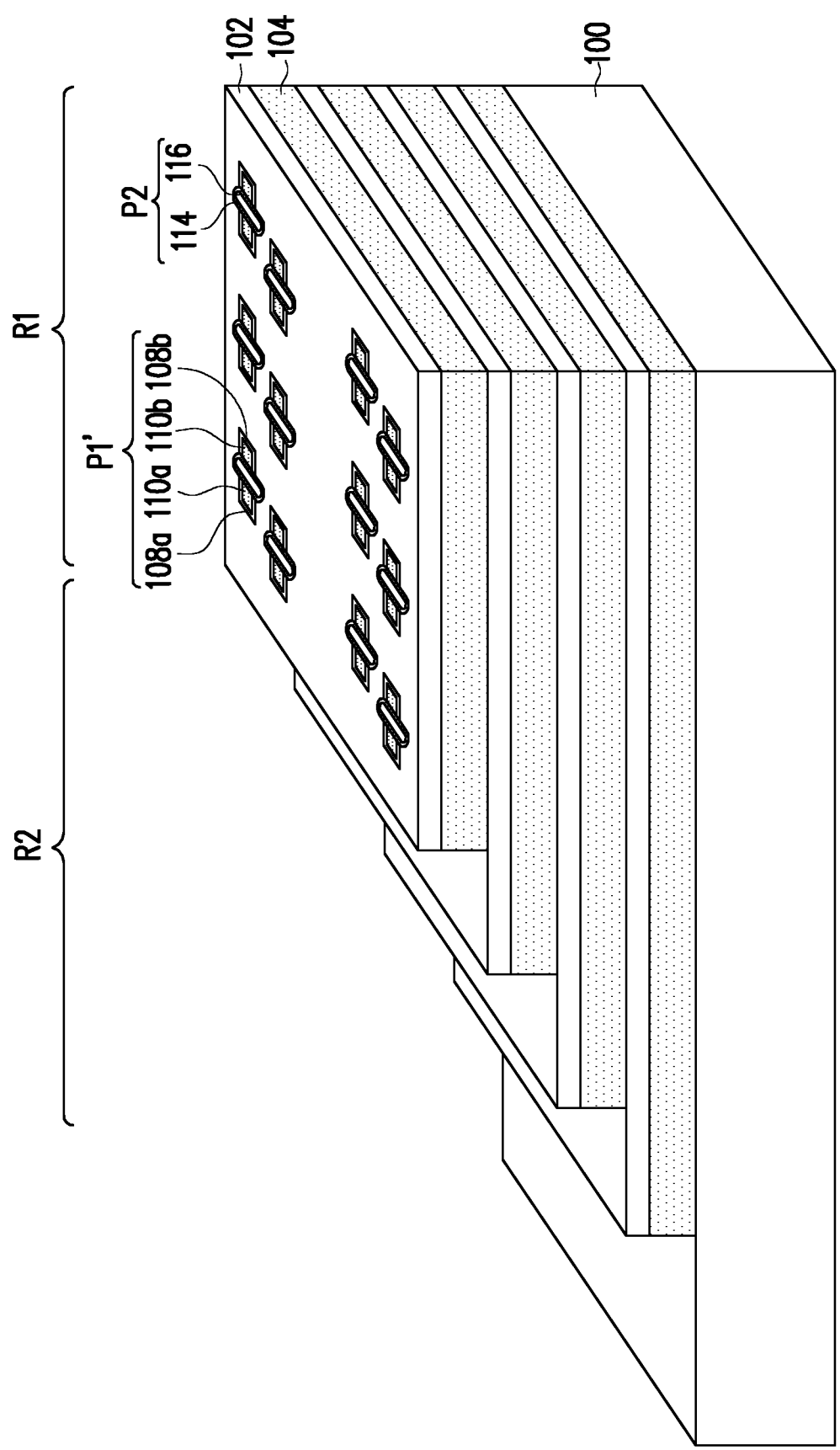

Next, referring to FIG. 1F, after the second pillar structures P2 are formed, the stack structure 101 are patterned to form a staircase structure. It should be noted in advance that after the second pillar structures P2 are formed, a unit cell region R1 and a peripheral region R2 are defined. In detail, the remaining first pillar structures P1' and the second pillar structures P2 are formed as the unit cell region R1, and the rest region is the peripheral region R2. The staircase structure is formed in the peripheral region R2. The forming of the staircase structure is to perform a continuous patterning process on the portion of the stack structure 101 in which the first pillar structures P1 and the second pillar structures P2 are not formed. From another perspective, the distance of the first insulating layers 102 and the first sacrificial layers 104 protruding from the unit cell region R1 decreases as the first insulating layers 102 and the first sacrificial layers 104 are gradually away from the substrate 100. Afterwards, a planarization process is performed on the staircase structure (not shown in FIG. 1F). In other words, the staircase structure is filled with a insulating layer (not shown in FIG. 1F) to form a planarized surface.

Figure 1G:
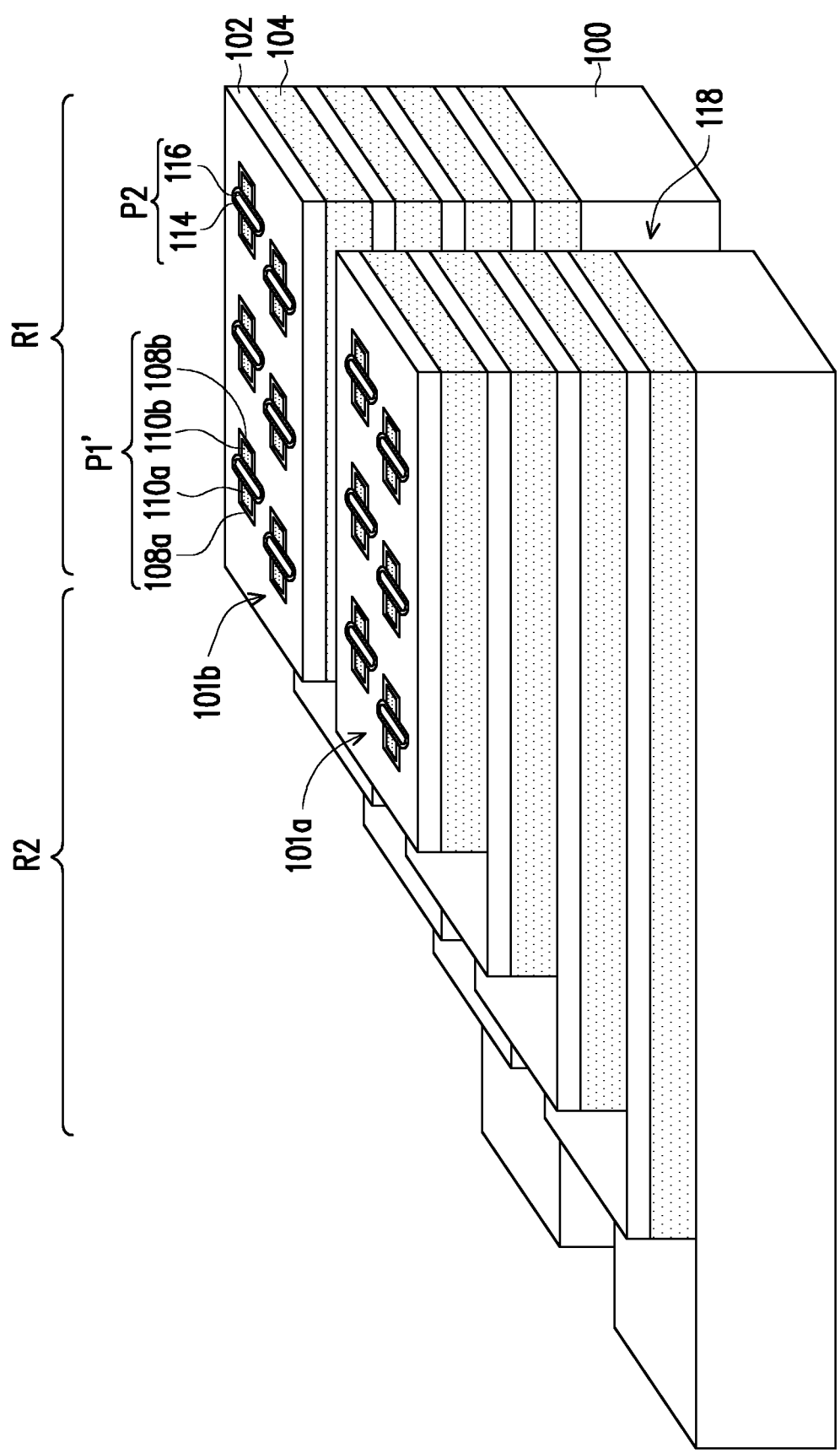

Afterwards, referring to FIG. 1G, a trench 118 penetrating through the stack structure 101 is formed. In the present embodiment, the trench 118 is formed along a direction in which the staircase structure is formed to divide the stack structure 101 into a pair of stack structures 101a, 101b. The trench 118 exposes, for example, the first insulating layers 102 and the first sacrificial layers 104 on the sidewalls facing each other on the pair of stack structures 101a, 101b. The step of forming the trench 118 penetrating through the stack structure 101 includes, for example, the steps as follows. Firstly, a mask layer (not shown) is formed on the stack structure 101. Afterwards, an etching process is performed on the stack structure 101 by using the mask layer to form the trench 118 in the stack structure 101. In some embodiments, the portion of the substrate 100 is also removed simultaneously after the trench is formed.

Figure 1H:
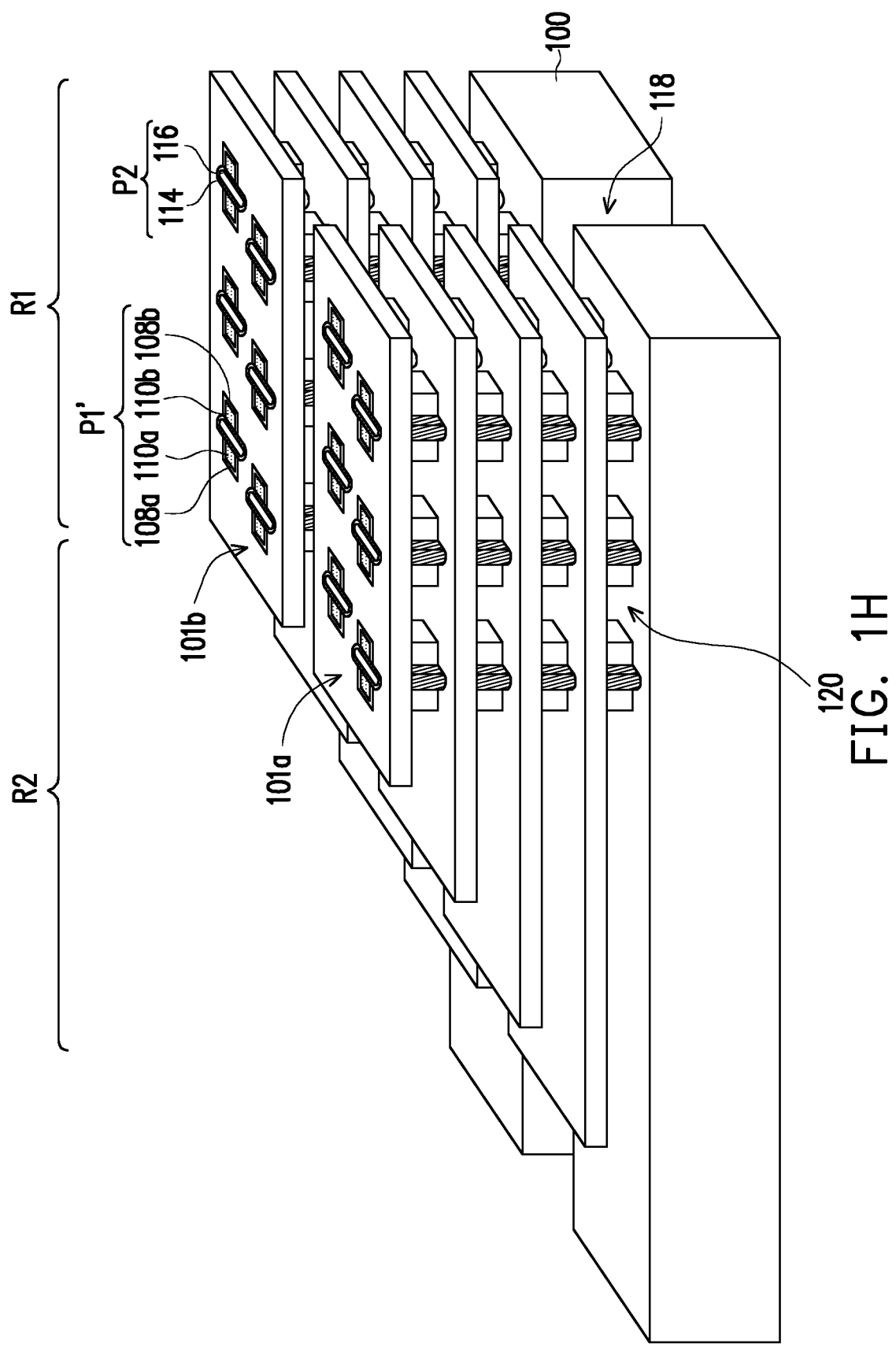

Next, referring to FIG. 1H, the first sacrificial layers 104 exposed by the trench 118 are removed to form the lateral opening 120. The lateral opening 120 exposes, for example, portions of the second insulating layers 108a, 108b and a portion of the channel layers 114, which are more clearly shown in FIG. 2. The method of removing the first sacrificial layers 104 exposed by the lateral opening 120 is, for example, a dry etching method or a wet etching method. Etchant used in the dry etching method is, for example, $NF_3$, $H_2$, HBr, $O_2$, Nz, He, or a combination thereof, and etchant used in the wet etching method is, for example, a phosphoric acid ($H_3PO_4$) solution. In the present embodiment, the first sacrificial layers 104 exposed by the trench 118 are removed by the wet etching method.

Figure 1I:
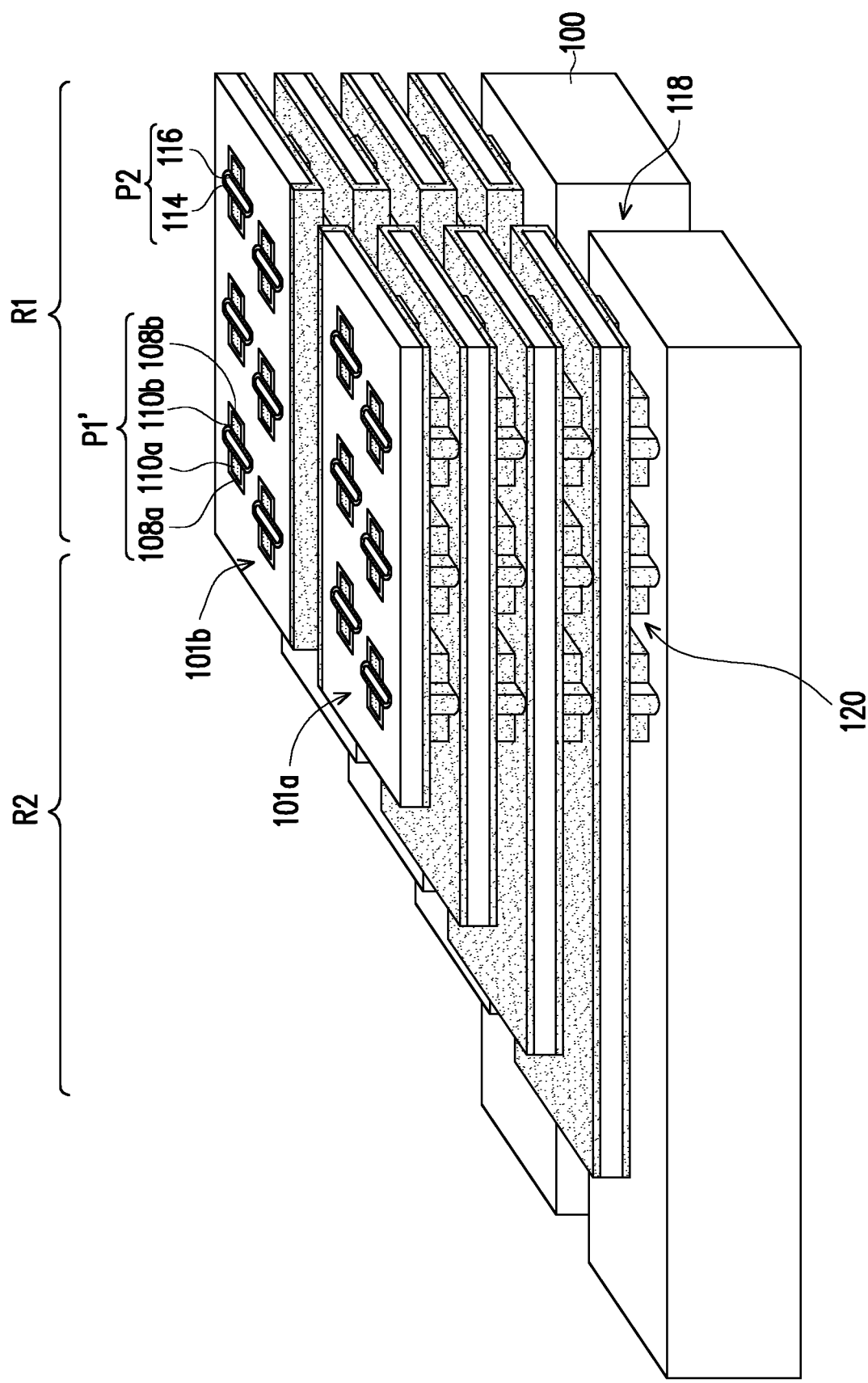

Afterwards, referring to FIG. 1I and FIG. 2 at the same time, a gate dielectric layer 122 is formed in the lateral opening 120. The gate dielectric layer 122 is, for example, a conformal layer. In detail, the gate dielectric layer 122 covers the second insulating layers 108a, 108b and the channel layers 114 exposed by the lateral opening 120 in conformity to the shape of the lateral opening 120, as shown in FIG. 2. In addition, the gate dielectric layer 122 needs to have a good staircase coverage to achieve good film thickness uniformity. The material of the gate dielectric layer 122 is, for example, an oxide, a nitride, or a combination thereof. In some embodiments, the gate dielectric layer 122 includes an oxide-nitride-oxide (ONO) composite layer. For example, the gate dielectric layer 122 includes a composite layer composed of a silicon dioxide layer, a silicon nitride layer, and a silicon dioxide layer. In other embodiments, the gate dielectric layer 122 includes an oxide-nitride-oxide-nitride-oxide (ONONO) composite layer. For example, the gate dielectric layer 122 includes a composite layer composed of a silicon dioxide layer, a silicon nitride layer, a silicon dioxide layer, a silicon nitride layer, and a silicon dioxide layer. Furthermore, in some embodiments, the gate dielectric layer 122 is formed on sidewalls, facing each other, of the first insulating layers 102 in the pair of stack structures 101a, 101b.

Figure 1J:
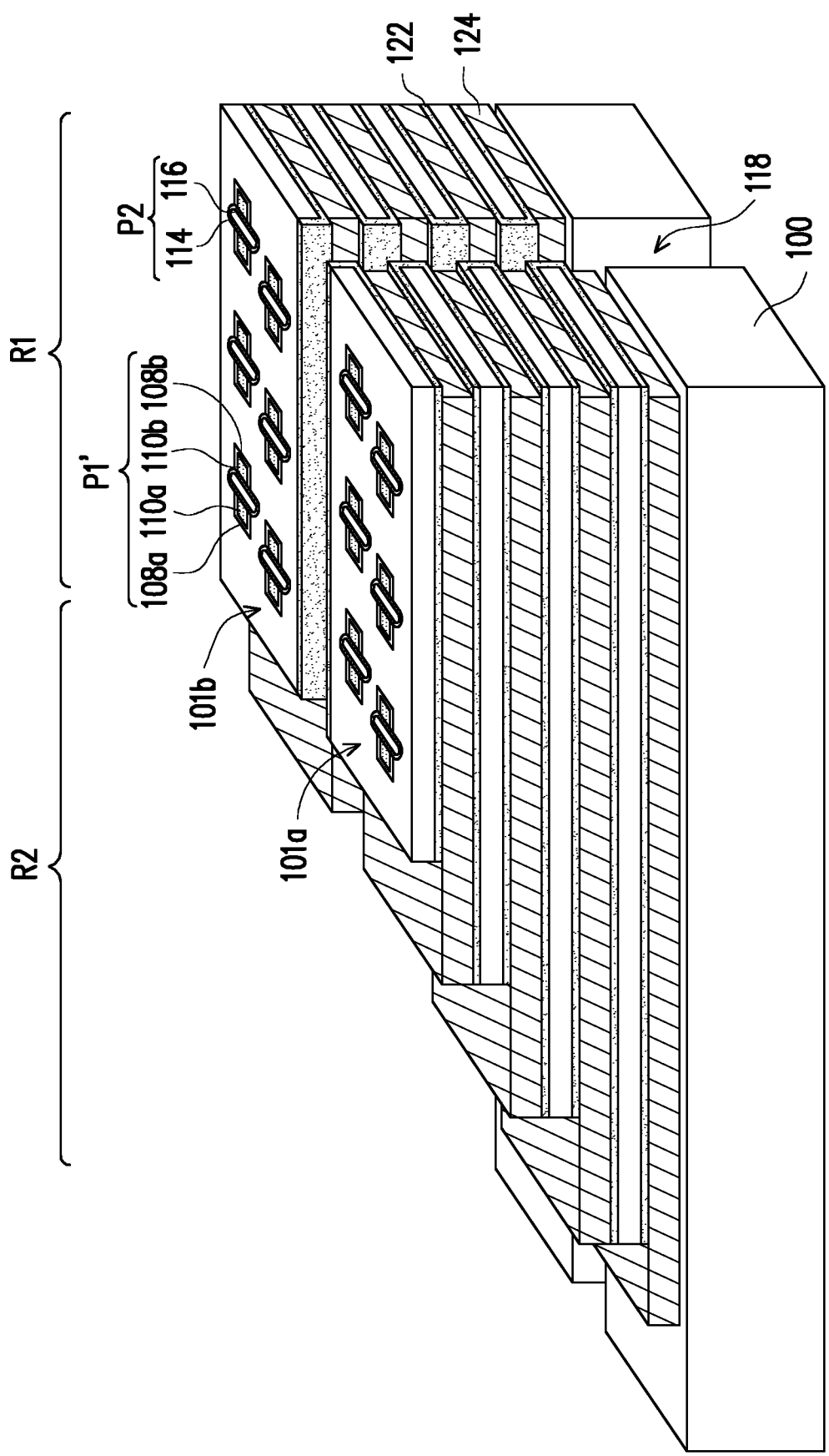

Afterwards, referring to FIG. 1J, gate layers 124 are filled into the lateral opening 120. The material of the gate layers 124 is, for example, polysilicon, amorphous silicon, tungsten (W), cobalt (Co), aluminum (Al), tungsten silicide ($WSi_x$), or cobalt silicide ($CoSi_x$). The method of forming the gate layers 124 is, for example, a chemical vapor deposition method. In the present embodiment, the gate layers 124 are used as a word line. In some embodiments, before the gate layers 124 are filled into the lateral opening 120, a buffer layer (not shown) and a barrier layer (not shown) are sequentially formed in the lateral opening 120. The material of the buffer layer is, for example, a high-dielectric-constant material having a dielectric constant of greater than 7. For example, the material of the buffer layer is aluminum oxide ($Al_2O_3$), hafnium oxide ($HfO_2$), lanthanum oxide ($La_2O_5$), a transition metal oxide, a lanthanide oxide, or a combination thereof. The method of forming the buffer layer is, for example, the chemical vapor deposition method or an atomic layer deposition method. The material of the barrier layer is, for example, titanium (Ti), titanium nitride (TiN), tantalum (Ta), tantalum nitride (TaN), or a combination thereof. The method of forming the barrier layer is, for example, the chemical vapor deposition method.

Figure 1K:
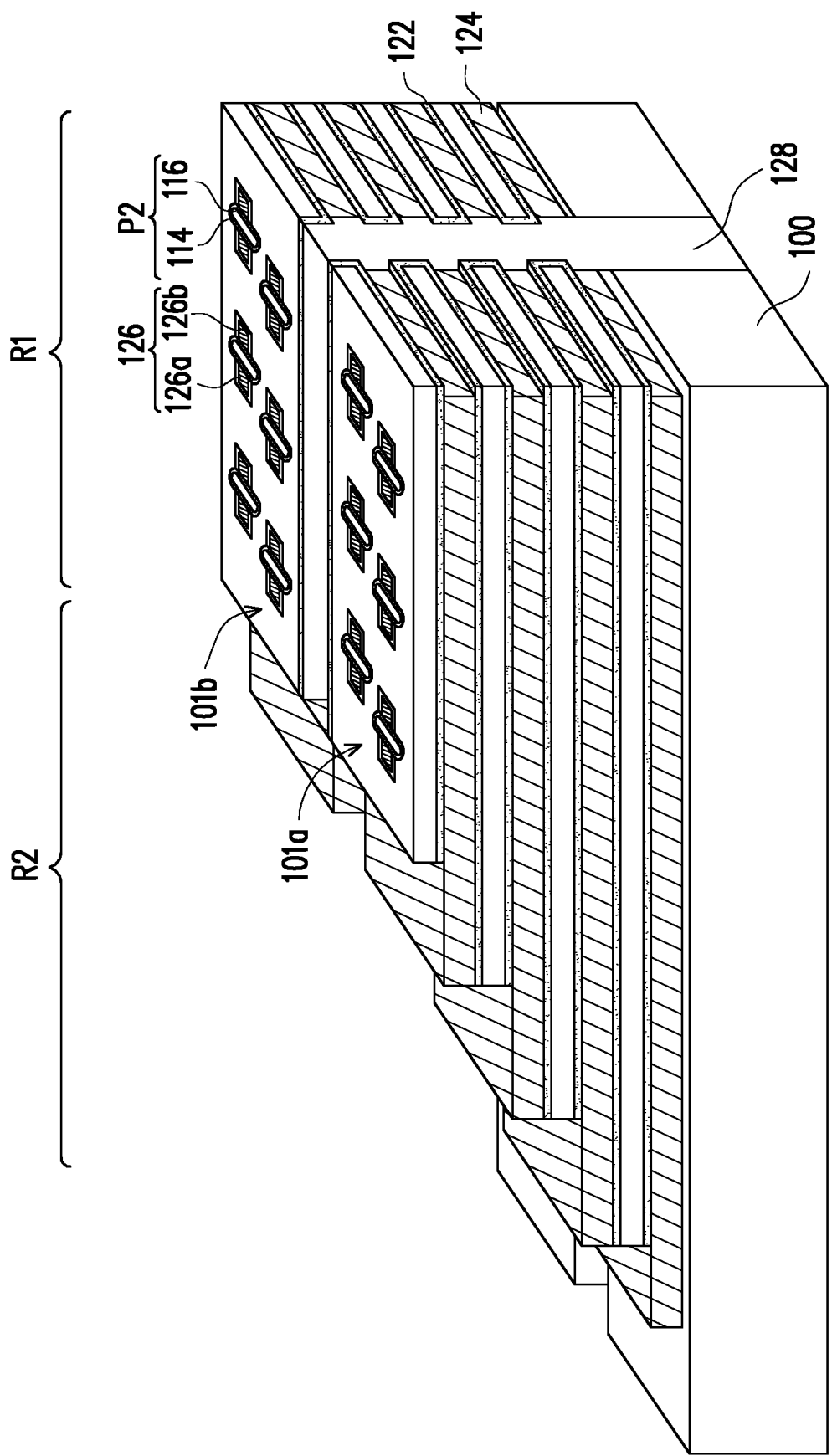

Afterwards, referring to FIG. 1K, the second sacrificial layers 110a, 110b are replaced by conductor layers 126 by, for example, performing the steps as follows. Firstly, the second sacrificial layers 110a, 110b are removed by the dry etching method or the wet etching method to form a third opening (not shown). Next, the conductor layers 126 are filled into the third opening. The material of the conductor layers 126 is, for example, polysilicon, doped polysilicon, or other conductive metal material. In the present embodiment, the conductor layers 126 are used as a source layer or a drain layer. For example, the conductor layer 126 replacing the second sacrificial layer 110a serves as the source layer, and the conductor layer 126 replacing the second sacrificial layer 110b serves as the drain layer, but the present invention is not limited thereto. The cross-sectional areas of the conductor layer 126 replacing the second sacrificial layer 110a and the conductor layer 126 replacing the second sacrificial layer 110b are the same or different, and the present invention is not particularly limited. The method of forming the source/drain layer of the present embodiment is to replace the previously formed first sacrificial layers 110a, 110b with the conductor layers 126, which is a self-aligning process, and therefore has the advantages of simple process and high process yield. Furthermore, the formed source/drain layer has substantially the same distance as the gate layers 124 because the periphery is respectively provided with the second insulating layers 108a, 108b conformal thereto, so that the three-dimensional AND flash memory 10 of the embodiments of the present invention is stably operated.

In addition, before the second sacrificial layers 110a, 110b are replaced by the conductor layers 126, third insulating layers 128 are filled into the trench 118. The third insulating layers 128 cover, for example, the gate dielectric layer 122 and the gate layers 124 on the sidewalls, facing each other, of the pair of stack structures 101a, 101b.

Figure 1L:
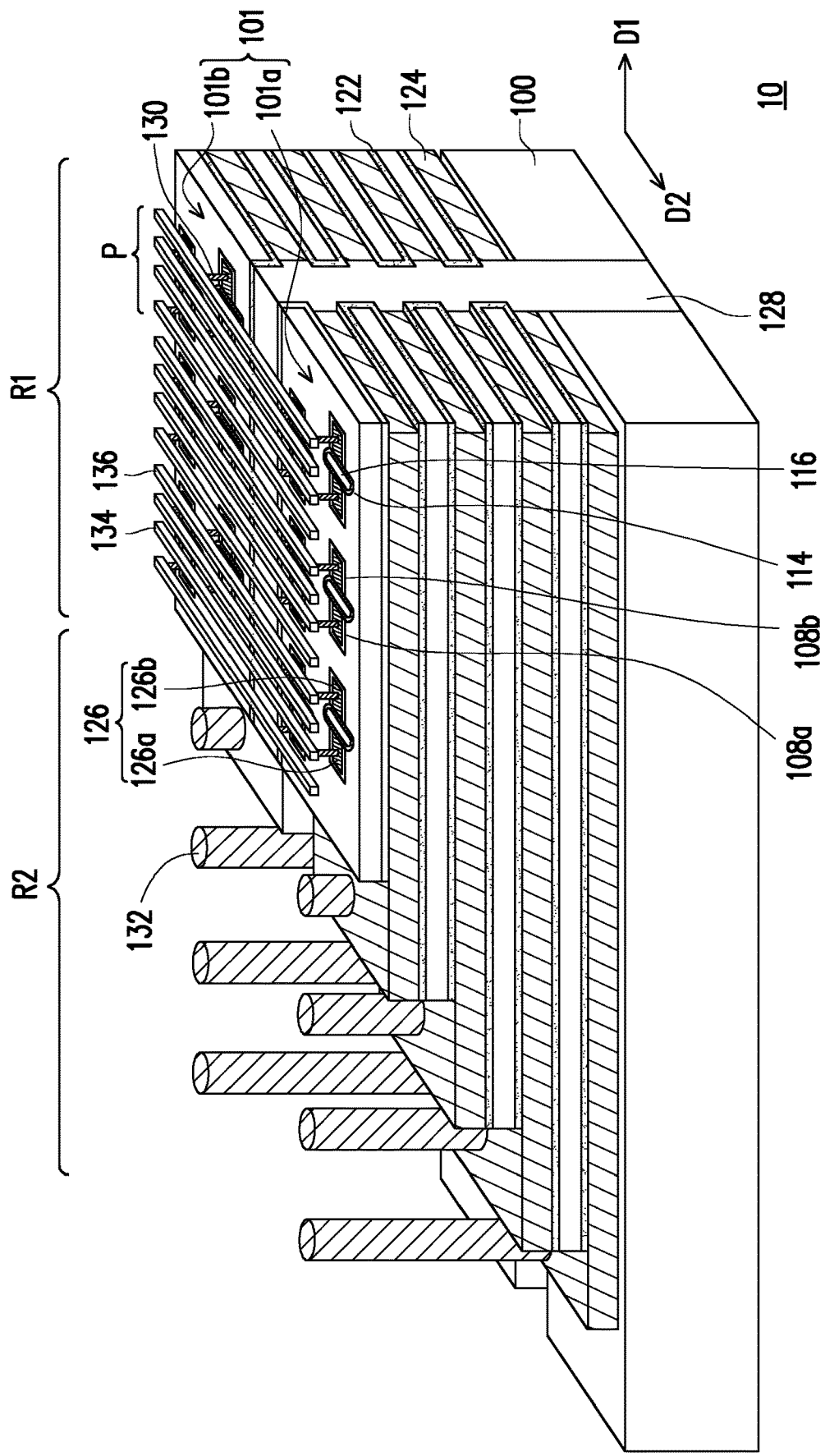

Finally, referring to FIG. 1L, a first contact member 130 electrically connected to the conductor layers 126 located in the unit cell region R1 and a second contact member 132 electrically connected to the gate layers 124 (which is a staircase structure) located in the peripheral region R2 are formed. Each of the conductor layers 126 is, for example, correspondingly provided with the first contact member 130, and the gate layers 124 of each stair are correspondingly provided with the second contact member 132. Next, a source line connecting line 134 and a bit line connecting line 136 are formed. The source line connecting line 134 electrically connects the conductor layers 126 as the source layer in the pair of stack structures 101a, 101b, for example, through the first contact member 130, and the bit line connecting line 136 electrically connects the conductor layers 126 as the drain layer in the pair of stack structures 101a, 101b, for example, through the first contact member 130. The material of the source line connecting line 134 and the bit line connecting line 136 is, for example, a metal material.

Thus, the manufacturing of the three-dimensional AND flash memory 10 of the present invention is completed.

The manufacturing method of the three-dimensional AND flash memory 10 of the present embodiment is described by taking the above method as an example. However, the method of forming the three-dimensional AND flash memory 10 of the present invention is not limited thereto.

With continued reference to FIG. 1L, FIG. 1L shows a schematic view of a three-dimensional AND flash memory according to an embodiment of the present invention. The three-dimensional AND flash memory 10 of the embodiment of the present invention includes a substrate 100, a stack structure 101, and pillar structures P. The pillar structures P penetrate through the stack structure 101. The substrate 100 includes, for example, a unit cell region R1 and a peripheral region R2. The pillar structures P are located in the unit cell region R1, and a staircase structure is formed in the peripheral region R2. The stack structure 101 are located on the substrate 100 and includes, for example, a pair of stack structures 101a, 101b. A third insulating layer 128 is disposed, for example, between the pair of stack structures 101a, 101b. In an embodiment, the stack structure 101 includes first insulating layers 102 and gate layers 124 which are alternately disposed. A portion of the first insulating layers 102 and a portion of the gate layers 124 protruding from the unit cell region R1 form a staircase structure, for example, in the peripheral region R2. In the present embodiment, a gate dielectric layer 122 is disposed between the first insulating layers 102 and the gate layers 124. It should be noted here that the gate dielectric layer 122 is not disposed only between the first insulating layers 102 and the gate layers 124. In detail, the gate dielectric layer 122 is further disposed on sidewalls, facing each other, of the first insulating layers 102 in the pair of stack structures 101a, 101b. Furthermore, the gate dielectric layer 122 is further disposed on the sidewalls of the pillar structures P exposed by the first insulating layers 102. That is, the gate dielectric layer 122 surrounds the sidewalls of the pillar structures P exposed by the first insulating layers 102.

In an embodiment, the pillar structures P include insulating pillars 116, channel layers 114, conductor layers 126, and second insulating layers 108a, 108b. The insulating pillars 116 have, for example, an elliptical profile. That is, the outline from the top end to the bottom end of the insulating pillars 116 is elliptical. The channel layers 114 surround the insulating pillars 116 and are conformal to insulating pillars 116. Each conductor layer 126 is located on two sides of one channel layer 114 and is in contact with the channel layer 114. In other words, the conductor layers 126 include two conductor layers 126a, 126b, which are respectively located on the opposite sides of the channel layer 114 and respectively serve as a source and a drain. In the present embodiment, the conductor layers 126 face the long-axis cross sections of the insulating pillars 116. The second insulating layers 108a, 108b respectively surround, for example, the sidewalls, not in contact with the channel layer 114, of the conductor layers 126.

The three-dimensional AND flash memory 10 of the embodiment of the present invention further includes a first contact member 130, a second contact member 132, a source line connecting line 134, and a bit line connecting line 136. The first contact member 130 is, for example, located on the unit cell region R1 and electrically connected to the conductor layers 126, and the second contact member 132 is, for example, located on the peripheral region R2 and electrically connected to the gate layers 124. The source line connecting line 134 electrically connects the conductor layers 126 as the source layer in the pair of stack structures 101a, 101b, for example, through the first contact member 130, and the bit line connecting line 136 electrically connects the conductor layers 126 as the drain layer in the pair of stack structures 101a, 101b, for example, through the first contact member 130.

In the present embodiment, a plurality of the pillar structures P is provided, and the pillar structures P are separated from each other. The pillar structures P are sequentially arranged, for example, in a first direction D1, and staggered in a second direction D2. The second direction D2 is orthogonal to the first direction D1. The plurality of pillar structures P is separated from each other and each pillar structure P has an independent source and an independent drain (conductor layers 126), and therefore, a memory cell (the intersection points of the gate layers 124 and the pillar structures P) is arbitrarily selected by selecting a certain gate layer 124 and a certain conductor layer 126, so that the three-dimensional AND flash memory 10 of the present embodiment has a high operation speed.

Figure 3:
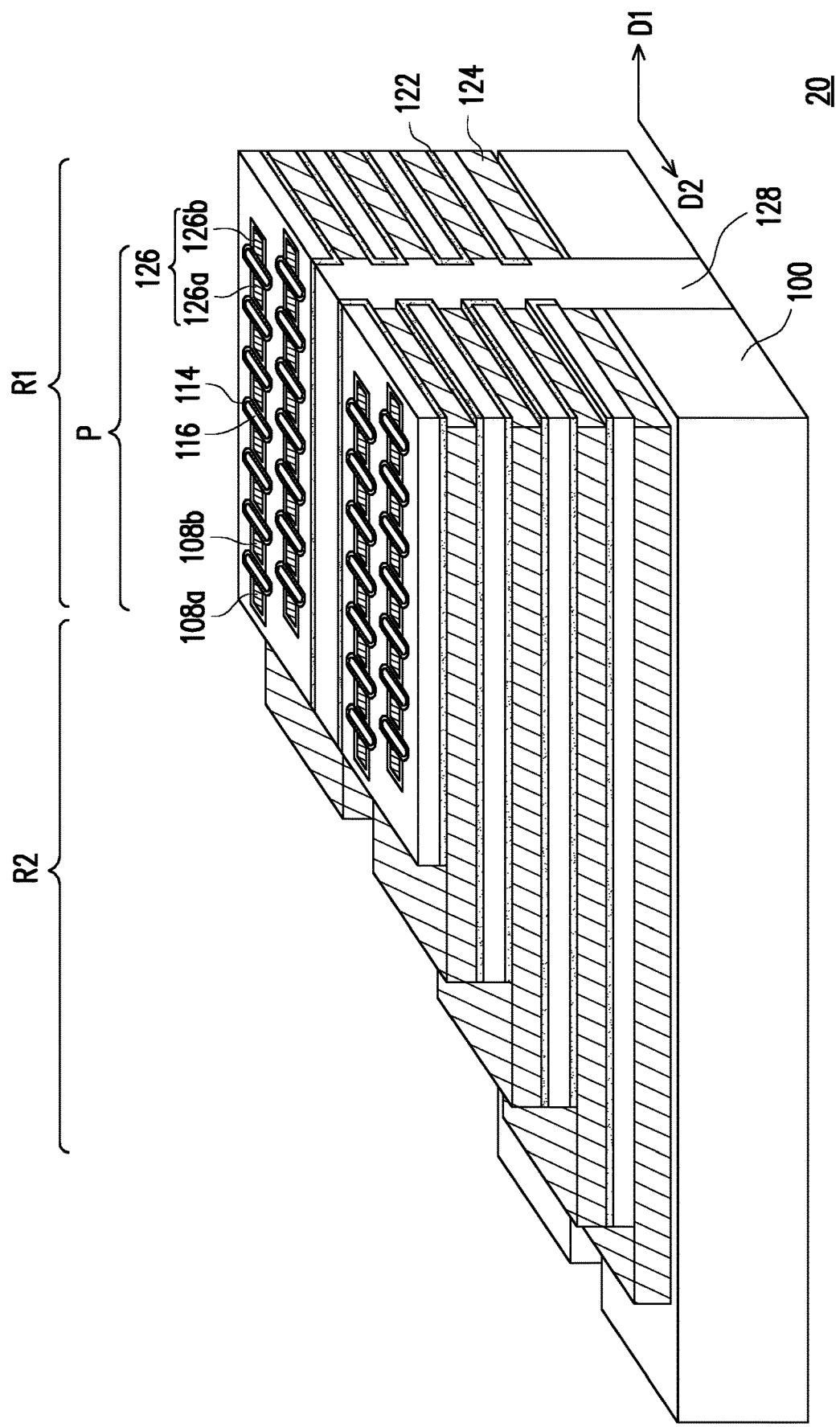
FIG. 3 is a schematic view of a three-dimensional AND flash memory according to another embodiment of the present invention.

FIG. 3 is a schematic view of a three-dimensional AND flash memory according to another embodiment of the present invention. It should be noted here that the embodiment of FIG. 3 adopts the element symbols and partial contents of the embodiment of FIG. 1L. The same or similar symbols are used to denote the same or similar elements, and the description of the same technical contents is omitted. For the description of the omitted part, reference is made to the description and effects of the foregoing embodiments, and the descriptions thereof are omitted in the following embodiment. For the description of at least a part of the embodiment of FIG. 3 that is not omitted, reference is made to the contents below.

The difference between a three-dimensional AND flash memory 20 of the present embodiment and the three-dimensional AND flash memory 10 of the foregoing embodiments is that the plurality of pillar structures P is not arranged in the first direction D1, and each pillar structure P includes a plurality of insulating pillars 116, a plurality of channel layers 114, a plurality of conductor layers 126, and a plurality of second insulating layers 108a, 108b. In detail, since one pillar structure P includes the plurality of insulating pillars 116 and the plurality of channel layers 114, most of the conductor layers 126 are in contact with the adjacent two channel layers 114 in the first direction D1, so that it has a profile similar to the shape of sugar-coated haws on a stick. In addition, the plurality of pillar structures P is separated from each other in the second direction D2 and each pillar structure P includes a plurality of shareable sources and drains (conductor layers 126), and therefore, the memory cell (the intersection points of the gate layers 124 and the pillar structures P) is arbitrarily selected by selecting a certain gate layer 124 and two certain conductor layers 126, so that the three-dimensional AND flash memory 20 of the present embodiment has a high operation speed. Furthermore, since each of the pillar structures P has a source and a drain (conductor layers 126) which are shared by adjacent memory cells, the size of the three-dimensional AND flash memory 20 is further reduced.

Based on the above, in the above embodiments, the position of the source layer/drain layer to be subsequently formed is defined by sequentially forming the first pillar structures and the second pillar structures, so that the source layer/drain layer is formed by a simple process and has a high process yield. The formed source layer/drain layer has substantially the same distance as the gate layers due to the conformal second insulating layers, so that the three-dimensional AND flash memory of the present invention is stably operated. In addition, in the three-dimensional AND flash memory of the present invention, each pillar structure has an independent conductor layer, and therefore, the memory cell (the intersection points of the gate layers and the pillar structures) is arbitrarily selected by selecting a certain gate layer and a certain conductor layer, so that the three-dimensional AND flash memory of the present invention has a high operation speed.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A manufacturing method of a three-dimensional AND flash memory, comprising:
    forming a stack structure on a substrate, wherein the stack structure comprises first insulating layers and first sacrificial layers which are alternately stacked;
    forming a first pillar structure penetrating through the stack structure and having a rectangle-like profile, wherein the first pillar structure comprises a second insulating layer and a second sacrificial layer, and the second insulating layer surround the second sacrificial layer;
    forming a second pillar structure penetrating through the stack structure and having an elliptical profile, wherein the second pillar structure comprises a channel layer and an insulating pillar, the channel layer surrounds the insulating pillar, and the second sacrificial layer is located on two sides of the channel layer and is in contact with the channel layer, wherein the second sacrificial layer face a long-axis cross section of the second pillar structure;
    removing the first sacrificial layers to form a lateral opening, wherein the lateral opening exposes a portion of the second insulating layer and a portion of the channel layer;
    forming a gate dielectric layer in the lateral opening, wherein the gate dielectric layer surrounds the second insulating layer and the channel layer which are exposed;
    filling a gate layer into the lateral opening; and
    replacing the second sacrificial layer with a conductor layer.

2. The manufacturing method of the three-dimensional AND flash memory according to claim 1, wherein steps of forming the first pillar structure comprises:
    forming a first opening penetrating through the stack structure, wherein the first opening has a rectangle-like profile;
    forming the second insulating layer on a sidewall of the first opening; and
    filling the second sacrificial layer into the first opening.

3. The manufacturing method of the three-dimensional AND flash memory according to claim 1, wherein steps of forming the second pillar structure comprises:
    forming a second opening penetrating through the stack structure, wherein the second opening has an elliptical profile, and a portion of the second insulating layer and a portion of the second sacrificial layer are removed;
    forming the channel layer on a sidewall of the second opening; and
    filling the insulating pillar into the second opening.

4. The manufacturing method of the three-dimensional AND flash memory according to claim 1, wherein after the second pillar structure is formed, the stack structure are patterned to form a staircase structure.

5. The manufacturing method of the three-dimensional AND flash memory according to claim 1, wherein steps of removing the first sacrificial layers to form the lateral opening comprises:
    forming a trench penetrating through the stack structure, wherein the trench exposes the first sacrificial layers; and
    laterally etching the first sacrificial layers.

6. The manufacturing method of the three-dimensional AND flash memory according to claim 1, wherein after the gate layer is filled into the lateral opening, a third insulating layer is filled into a trench.

7. The manufacturing method of the three-dimensional AND flash memory according to claim 1, wherein after the second sacrificial layer is replaced with the conductor layer, a first contact member electrically connected to the conductor layer is formed.

8. A three-dimensional AND flash memory, comprising:
    a stack structure, located on a substrate and comprising first insulating layers and gate layers which are alternately disposed, wherein a gate dielectric layer is disposed between the first insulating layers and the gate layers; and
    a pillar structure, penetrating through the stack structure, comprising:
        an insulating pillar, having an elliptical profile;
        a channel layer, surrounding the insulating pillar;
        a conductor layer, located on two sides of the channel layer and in contact with the channel layer, wherein the conductor layer faces a long-axis cross section of the insulating pillar; and
        a second insulating layer, surrounding a sidewall of the conductor layer not in contact with the channel layer,
    wherein the gate dielectric layer surrounds a sidewall of the pillar structure exposed by the first insulating layers.

9. The three-dimensional AND flash memory according to claim 8, wherein the substrate comprises a unit cell region and a peripheral region, the pillar structure are located on the unit cell region, and a portion of the gate layers protruding from the unit cell region form a staircase structure in the peripheral region.

10. The three-dimensional AND flash memory according to claim 8, comprising a pair of stack structures, wherein a third insulating layer is disposed between the pair of stack structures.

11. The three-dimensional AND flash memory according to claim 10, wherein sidewalls, facing each other, of the first insulating layers in the pair of stack structures are provided with the gate dielectric layer.

12. The three-dimensional AND flash memory according to claim 8, further comprising a first contact member, wherein the first contact member is located on the unit cell region and electrically connected to the conductor layer.

13. The three-dimensional AND flash memory according to claim 8, further comprising a second contact member, wherein the second contact member is located on the peripheral region and electrically connected to the gate layers.

14. The three-dimensional AND flash memory according to claim 8, wherein the gate dielectric layer comprises an oxide-nitride-oxide composite layer.

15. The three-dimensional AND flash memory according to claim 8, wherein a plurality of pillar structures is provided, and the plurality of pillar structures are sequentially arranged in a first direction and staggered in a second direction orthogonal to the first direction.

16. The three-dimensional AND flash memory according to claim 8, wherein a plurality of pillar structures is provided, and one of the plurality of pillar structures comprises a plurality of insulating pillars, a plurality of the channel layers, a plurality of the conductor layers, and a plurality of the second insulating layers.

* * * * *